(12) United States Patent
Park et al.

(10) Patent No.: US 11,569,308 B2
(45) Date of Patent: Jan. 31, 2023

(54) COLOR-CONVERTING SUBSTRATE AND DISPLAY DEVICE INCLUDING THE SAME

(71) Applicant: Samsung Display Co., Ltd., Yongin-si (KR)

(72) Inventors: Hyunbae Park, Seoul (KR); Seunghee Lee, Paju-si (KR); Wal Jun Kim, Hwaseonq-si (KR); Kiwan Ahn, Seoul (KR); Joosun Yoon, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 75 days.

(21) Appl. No.: 17/157,730

(22) Filed: Jan. 25, 2021

(65) Prior Publication Data

US 2021/0273022 A1 Sep. 2, 2021

(30) Foreign Application Priority Data

Feb. 28, 2020 (KR) .................. 10-2020-0025204

(51) Int. Cl.
*H01L 27/32* (2006.01)
*H01L 51/50* (2006.01)
*H01L 51/52* (2006.01)

(52) U.S. Cl.
CPC .......... *H01L 27/322* (2013.01); *H01L 51/502* (2013.01); *H01L 51/5237* (2013.01); *H01L 51/5268* (2013.01); *H01L 51/5271* (2013.01)

(58) Field of Classification Search
CPC . H01L 27/322; H01L 51/502; H01L 51/5271; H01L 27/3244; H01L 27/3211; H01L 51/52; G02B 5/26; G02F 1/133553
See application file for complete search history.

(56) References Cited

U.S. PATENT DOCUMENTS

| 9,952,740 B1 | 4/2018 | Kim et al. |
| 2015/0206911 A1* | 7/2015 | Kokubun .......... H01L 27/14621 438/70 |
| 2019/0137815 A1 | 5/2019 | Kim et al. |
| 2019/0265390 A1 | 8/2019 | Lim |
| 2020/0119237 A1 | 4/2020 | Kim et al. |
| 2020/0168667 A1 | 5/2020 | Kim et al. |

FOREIGN PATENT DOCUMENTS

| KR | 10-2014-0086934 | 7/2014 |
| KR | 10-2018-0045974 | 5/2018 |
| KR | 10-2019-0050886 | 5/2019 |
| KR | 10-2019-0103551 | 9/2019 |

* cited by examiner

*Primary Examiner* — Donald L Raleigh
(74) *Attorney, Agent, or Firm* — H.C. Park & Associates, PLC

(57) ABSTRACT

A color-converting substrate includes a color-converting part including a wavelength-converting particle configured to change a wavelength of an incident light to emit a light having a color different from the incident light, a color filter pattern filtering the light emitted from the color-converting part, and a light-reflective layer disposed between the color-converting part and the color filter pattern to selectively reflect a light having a wavelength same as the wavelength of the incident light.

20 Claims, 10 Drawing Sheets

COLOR-CONVERTING SUBSTRATE AND DISPLAY DEVICE INCLUDING THE SAME

CROSS REFERENCE TO RELATED APPLICATION

This application claims priority from and the benefit of Korean Patent Application No. 10-2020-0025204 filed on Feb. 28, 2020, which is hereby incorporated by reference for all purposes as if fully set forth herein.

BACKGROUND

Field

Exemplary embodiments/implementations of the invention relate generally to a color-converting substrate and, more specifically, to embodiments relate to a color-converting substrate and a display device including the color-converting substrate.

Discussion of the Background

An organic light-emitting display device is a self-emission display device, which is capable of generating a color image without an additional light source such as a backlight.

Recently, an organic light-emitting display device including a color filter and a color-converting part is being developed for improving a display quality. The color-converting part may change a wavelength of a light generated by a light-emitting element. Thus, the color-converting part may output a light having a color different from an incident light. For example, the color-converting part may include a wavelength-converting material such as a quantum dot.

The above information disclosed in this Background section is only for understanding of the background of the inventive concepts, and, therefore, it may contain information that does not constitute prior art.

SUMMARY

Embodiments provide a color-converting substrate with improved light efficiency.

Embodiments provide a display device with improved light efficiency.

Additional features of the inventive concepts will be set forth in the description which follows, and in part will be apparent from the description, or may be learned by practice of the inventive concepts.

According to an embodiment, a color-converting substrate includes a color-converting part including a wavelength-converting particle configured to change a wavelength of an incident light to emit a light having a color different from the incident light, a color filter pattern filtering the light emitted from the color-converting part, and a light-reflective layer disposed between the color-converting part and the color filter pattern to selectively reflect a light having a wavelength same as the wavelength of the incident light.

In an embodiment, the light-reflective layer covers a light-exiting surface and a side surface of the color-converting part.

In an embodiment, the light-reflective layer has a stacked structure including a plurality of layers having different refractive indexes.

In an embodiment, the light-reflective layer includes a wire-grid pattern.

In an embodiment, the light-reflective layer includes a nano-particle including silver.

In an embodiment, the nano-particle includes an oxide core and a metal shell including silver.

In an embodiment, the color-converting substrate further includes a compensation part configured to transmit an incident light without changing a wavelength of the incident light, wherein the compensation part does not overlap the light-reflective layer.

In an embodiment, the incident light is a blue light.

In an embodiment, the wavelength-converting particle includes a quantum dot.

In an embodiment, the color-converting part further includes a scattering particle.

According to an embodiment, a display device includes a first substrate including an array of pixels, and a second substrate combined with the first substrate. The second substrate includes a color-converting part including a wavelength-converting particle configured to change a wavelength of an incident light to emit a light having a color different from the incident light, a color filter pattern filtering the light emitted from the color-converting part, and a light-reflective layer disposed between the color-converting part and the color filter pattern to selectively reflect a light having a wavelength same as the wavelength of the incident light.

According to an embodiment, a display device includes an array of pixels, an encapsulation layer covering the pixels, a color-converting part disposed on the encapsulation layer and including a wavelength-converting particle configured to change a wavelength of an incident light to emit a light having a color different from the incident light, a color filter pattern disposed on the color-converting part and configured to filter the light emitted from the color-converting part, and a light-reflective layer disposed between the color-converting part and the color filter pattern to selectively reflect a light having a wavelength same as the wavelength of the incident light.

According to embodiments, a light passing through a color-converting part without changing a wavelength thereof may be reflected inwardly the color-converting parts. Thus, the light may be prevented from being absorbed by a color filter, and may be reused. Thus, a light efficiency of a color-converting substrate and a display device may be improved.

Thus, an amount of a scattering particle in the color-converting part may be reduced, or the scattering particle may be omitted.

When a light efficiency of the color-converting substrate is improved, a desired thickness of the color-converting part be reduced. Thus, an additional photolithography process of forming a partition wall having a multi-layered structure may be omitted.

Furthermore, when a light efficiency of the color-converting substrate is improved, an amount of a dye or a pigment in the color filter may be reduced.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

Features of embodiments of the invention will be more clearly understood from the following detailed description taken in conjunction with the accompanying drawings.

FIGS. 3, 4, and 5 are enlarged cross-sectional views illustrating the region 'A' of

FIG. 2.

DETAILED DESCRIPTION

Figure 1:
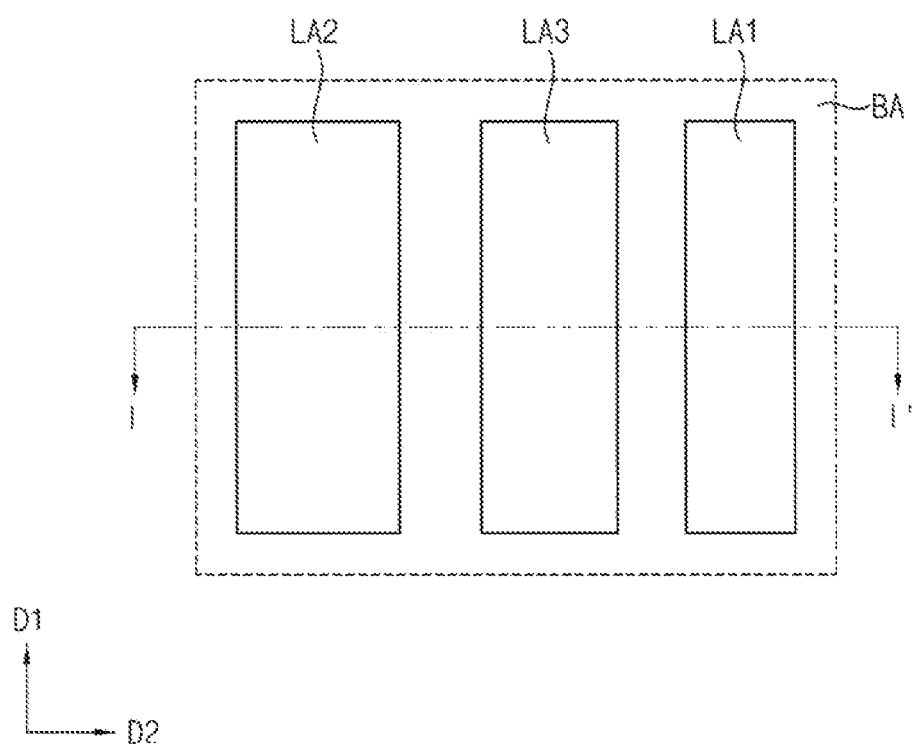
FIG. 1 is a plan view illustrating a pixel area of a display device according to an embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are illustrated in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

A color-converting substrate and a display device according to embodiments of the invention will be described hereinafter with reference to the accompanying drawings, in which some embodiments are illustrated. Same or similar reference numerals may be used for same or similar elements in the drawings.

Figure 2:
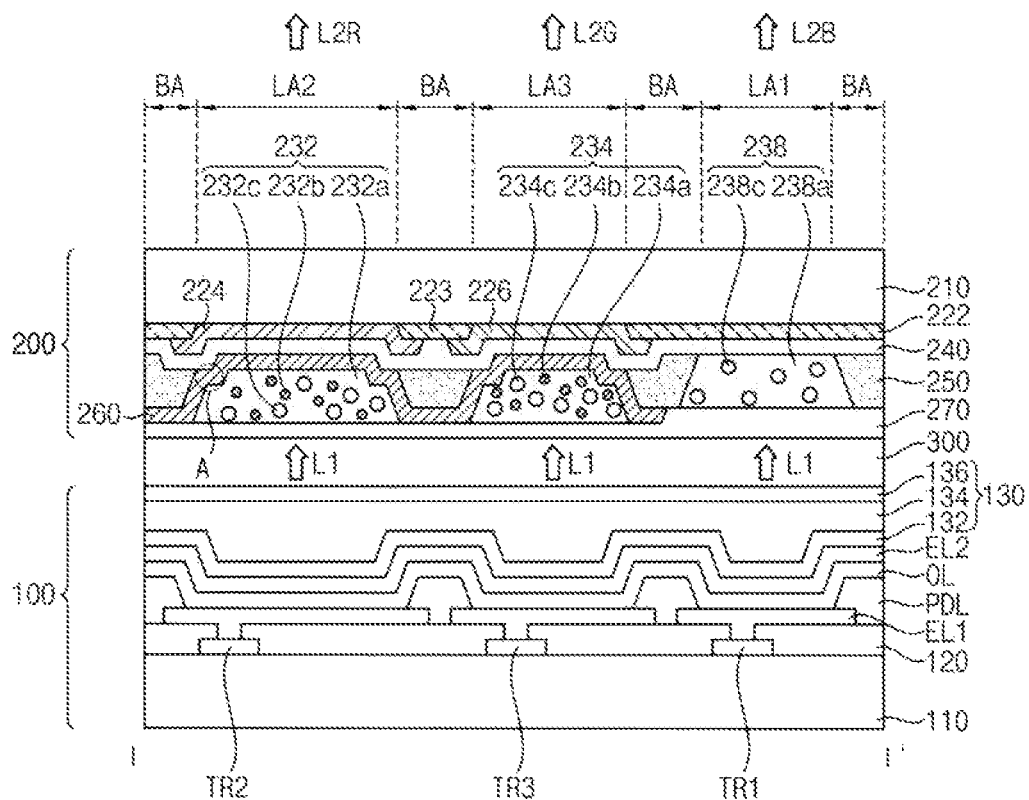
FIG. 2 is a cross-sectional view taken along the line I-I' of FIG. 1.
Figure 3:
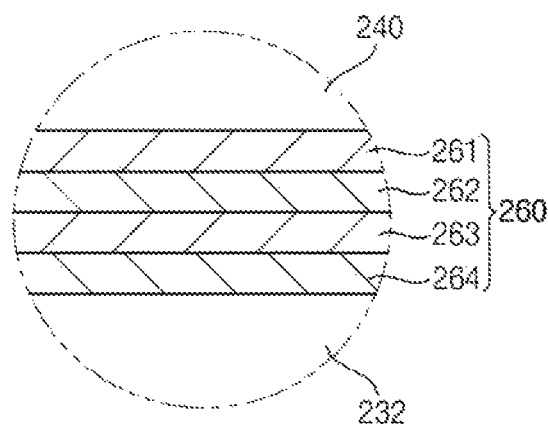
Figure 4:
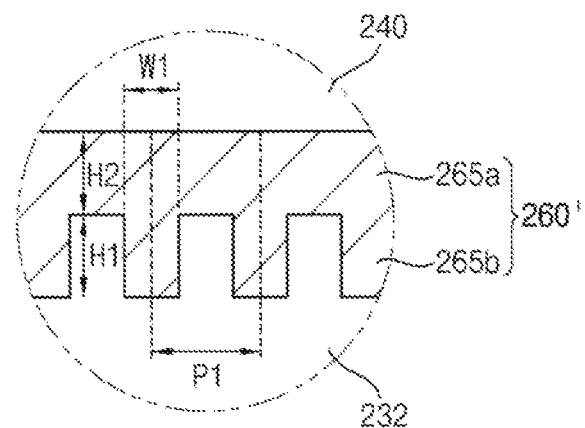
Figure 5:
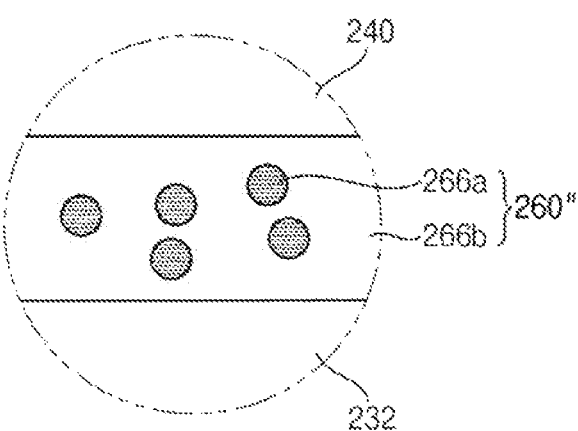

FIG. 1 is a plan view illustrating a pixel area of a display device according to an embodiment. FIG. 2 is a cross-sectional view taken along the line I-I' of FIG. 1. FIGS. 3 to 5 are enlarged cross-sectional views illustrating the region 'A' of FIG. 2.

Referring to FIGS. 1 and 2, a display device according to an embodiment includes a first substrate 100 and a second substrate 200. The first substrate 100 includes an array of pixels. Each of pixels may include a light-emitting element generating a light in response to a driving signal.

The second substrate 200 includes a color-converting part changing a wavelength of the light generated by the light-emitting element. Furthermore, the second substrate 200 includes a color filter transmitting a light having a specific color (a specific wavelength).

Referring to FIG. 1, the display device may include a display area generating an image and a peripheral area adjacent to or surrounding the display area. The display area may include a plurality of pixel areas. Each of the pixel areas may include a light-emitting area (LA1-LA3) emitting a light and a light-blocking area BA surrounding the light-emitting area. The light generated in the display device may exit outwardly through the light-emitting area.

The light-emitting area may emit lights having different colors. For example, the display device may include a first light-emitting area LA1 emitting a first color light, a second light-emitting area LA2 emitting a second color light and a third light-emitting area LA3 emitting a third color light.

In an embodiment, the first light-emitting area LA1 may emit a blue light, the second light-emitting area LA2 may emit a red light, and the third light-emitting area LA3 may emit a green light. However, embodiments are not limited thereto. For example, light-emitting areas may be configured or combined to emit a yellow light, cyan light and a magenta light.

Furthermore, light-emitting areas may emit at least four color lights. For example, light-emitting areas may be configured or combined to emit at least one of a yellow light, cyan light and a magenta light in addition to a red light, a blue light and a green light. Furthermore, light-emitting areas may be configured or combined to further emit a white light.

In an embodiment, the light-emitting areas LA1, LA2 and LA3 may have a substantially rectangular shape, respectively. However, embodiments are not limited thereto. For example, the light-emitting areas LA1, LA2 and LA3 may have different shapes from each other. Furthermore, the light-emitting areas LA1, LA2 and LA3 may have various shapes such as a square shape, a rhombus shape, a triangular shape, a circular shape or the like. An edge or a corner of each of light-emitting areas LA1, LA2 and LA3 may have a round shape or may be chamfered.

In an embodiment, the light-emitting areas LA1, LA2 and LA3 may have different sizes from each other. However, embodiments are not limited thereto. For example, the light-emitting areas LA1, LA2 and LA3 may have a same size.

Referring to FIG. 2, the first substrate 100 includes driving elements TR1, TR2 and TR3 disposed on a base substrate 110. The driving elements TR1, TR2 and TR3 may be electrically connected to a corresponding light-emitting element. The light-emitting element may be an organic light-emitting diode. For example, the organic light-emitting diode may include a first electrode EL1, a second electrode EL2 and an organic light-emitting layer OL disposed between the first electrode EL1 and the second electrode EL2.

For example, the base substrate 110 may include glass, quartz, sapphire, a polymeric material or the like.

In an embodiment, the driving elements TR1, TR2 and TR3 may include a thin film transistor. Each of the driving elements TR1, TR2 and TR3 may include a plurality of thin film transistors.

For example, a channel layer of the thin film transistor may include amorphous silicon, multi-crystalline silicon (polysilicon), a metal oxide. For example, the metal oxide two-component compound (ABx), ternary compound (ABxCy) or four-component compound (ABxCyDz), which contains indium (In), zinc (Zn), gallium (Ga), tin (Sn), titanium (Ti), aluminum (Al), hafnium (Hf), zirconium (Zr), magnesium (Mg). For example, the metal oxide may include zinc oxide (ZnOx), gallium oxide (GaOx), titanium oxide (TiOx), tin oxide (SnOx), indium oxide (InOx), indium-gallium oxide (IGO), indium-zinc oxide (IZO), indium tin oxide (ITO), gallium zinc oxide (GZO), zinc magnesium oxide (ZMO), zinc tin oxide (ZTO), zinc zirconium oxide (ZnZrxOy), indium-gallium-zinc oxide (IGZO), indium-zinc-tin oxide (IZTO), indium-gallium-hafnium oxide (IGHO), tin-aluminum-zinc oxide (TAZO), indium-gallium-tin oxide (IGTO) or the like.

The driving element TR may be covered by an insulation structure 120. The insulation structure may include a combination of an inorganic insulation layer and an organic insulation layer.

The first electrode EL1 may function as an anode. For example, the first electrode EL1 may be formed as a transmitting electrode or a reflecting electrode according to an emission type of the display device (a front emission type or a rear emission type). When the first electrode EL1 is a reflecting electrode, the first electrode EL1 may include gold (Au), silver (Ag), aluminum (Al), copper (Cu), nickel (Ni), platinum (Pt), magnesium (Mg), chromium (Cr), tungsten (W), molybdenum (Mo), titanium (Ti) or a combination thereof, and may have a stacked structure further including a metal oxide layer including indium tin oxide, indium zinc oxide, zinc tin oxide, indium oxide, zinc oxide, tin oxide or the like.

A pixel-defining layer PDL is disposed on the insulation structure 120, and has an opening overlapping at least a portion of the first electrode EL1. For example, the pixel-defining layer PDL may include an organic insulating material. At least a portion of the organic light-emitting layer OL may be disposed in the opening of the pixel-defining layer PDL. In an embodiment, the organic light-emitting layer OL may extend continuously over a plurality of pixel areas in the display area. In another embodiment, the organic light-emitting layer OL may be formed as a pattern separated from a light-emitting layer of an adjacent pixel.

The organic light-emitting layer OL may include at least a light-emitting layer, and may further include at least one of a hole injection layer (HIL), a hole transporting layer (HTL), an electron transporting layer (ETL) and an electron injection layer (EIL). For example, the organic light-emitting layer OL may include a low molecular weight organic compound or a high molecular weight organic compound.

In an embodiment, the organic light-emitting layer OL may generate a blue light. However, embodiments are not limited thereto. For example, the organic light-emitting layer OL may generate a red light, a green light or the like. In another embodiment, the organic light-emitting layer OL may generate lights having different colors in different pixels.

The second electrode EL2 may be formed as a transmitting electrode or a reflecting electrode according to an emission type of the display device. For example, the second electrode EL2 may include a metal, a metal alloy, a metal nitride, a metal fluoride, a conductive metal oxide or a combination thereof. For example, the second electrode EL2 may be formed as a common layer extending continuously over a plurality of pixels in the display area DA.

The first substrate 100 may further include an encapsulation layer 130 covering light-emitting elements. The encapsulation layer 130 may extend cover an entire portion of the display area.

For example, the encapsulation layer 130 may have a stacked structure of an inorganic thin film and an organic thin film. For example, as illustrated in FIG. 2, the encapsulation layer 130 may include a first inorganic thin film 132, an organic thin film 134 disposed on the first inorganic thin film 132, and a second inorganic thin film 136 disposed on the organic thin film 134. However, embodiments are not limited thereto. For example, the encapsulation layer 130 may have a structure including at least two organic thin films and at least three inorganic thin films.

For example, the organic thin film 134 include a cured resin such as polyacrylate, epoxy resin or the like. For example, the cured resin may be formed from cross-linking reaction of monomers. For example, the inorganic thin films 132 and 136 may include an inorganic material such as silicon oxide, silicon nitride, silicon carbide, aluminum oxide, tantalum oxide, hafnium oxide, zirconium oxide, titanium oxide or the like.

The second substrate 200 includes a color-converting part. The color-converting part changes a wavelength of a light L1 generated by the light-emitting element of the first substrate 100, and emits a light having a color different from the incident light L1. Furthermore, the second substrate 200 includes a color filter overlapping the color-converting part.

The color filter may be disposed between a base substrate 210 and the color-converting part. The color filter filters a light passing through the color filter to transmit a light having a specific color.

In an embodiment, the color filter may include a first color filter pattern 222, a second color filter pattern 224 and a third color filter pattern 226. The color filter patterns may overlap a corresponding light-emitting area. Thus, a color of lights L2R, L2B and L2G exiting from the light-emitting areas may be determined by the color filters.

In an embodiment, the first color filter pattern 222 overlaps the first light-emitting area LA1. For example, the first color filter pattern 222 may selectively transmit a blue light. The second color filter pattern 224 overlaps the second light-emitting area LA2. For example, the second color filter pattern 224 may selectively transmit a red light. The third color filter pattern 226 overlaps the third light-emitting area LA3. For example, the third color filter pattern 226 may selectively transmit a green light.

In the inventive concepts, "first", "second" or the like are not used for specific components. For example, a light-emitting area emitting a red light or a green light may be referred as to a first light-emitting area, and a red color filter pattern or a green color filter pattern may be referred as to a first color filter pattern.

The color filter may further include a light-blocking pattern 223 overlapping the light-blocking area BA. The light-blocking pattern 223 may be formed from a same layer as the first color filter pattern 222 and may be continuously connected to the first color filter pattern 222. In an embodiment, the light-blocking pattern 223 may be formed entirely in the light-blocking area BA. The light-blocking pattern 223 may prevent color mixture of pixel areas adjacent to each other.

The second substrate 200 may further include a first protective layer 240 covering the color filter. The first protective layer 240 may include an inorganic material such as silicon oxide, silicon nitride or the like.

The color-converting part overlaps a corresponding light-emitting area. For example, the second substrate 200 may include a first color-converting part 232 overlapping the second light-emitting area LA2.

The first color-converting part 232 may include a wavelength-converting particle 232$b$ and a resin part 232$a$.

For example, the wavelength-converting particle 232$b$ may include a quantum dot. The quantum dot may be defined as a nano-crystalline semiconductor material. The quantum dot may absorb an incident light and emit a light having a wavelength different from the incident light. For example, the quantum dot may have a diameter equal to or less than 100 nm. In an embodiment, the quantum dot may have a diameter of 1 nm to 20 nm.

For example the quantum dot may include a II-VI group compound, a III-V group compound, a IV-VI group compound, a IV group element, a IV group compound or a combination thereof.

For example, the II-VI group compound may include a binary compound selected from CdSe, CdTe, ZnS, ZnSe, ZnTe, ZnO, HgS, HgSe, HgTe, MgSe, MgS and a combination thereof, a ternary compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and a combination thereof, or a quaternary compound selected from HgZnTeS, CdZnSeS, CdZnSeTe, CdZnSTe, CdHgSeS, CdHgSeTe, CdHgSTe, HgZnSeS, HgZnSeTe, HgZnSTe and a combination thereof.

For example, the III-V group compound may include a binary compound selected from GaN, GaP, GaAs, GaSb, AlN, AlP, AlAs, AlSb, InN, InP, InAs, InSb and a combination thereof, a ternary compound selected from GaNP, GaNAs, GaNSb, GaPAs, GaPSb, AlNP, AlNAs, AlNSb, AlPAs, AlPSb, InNP, InNAs, InNSb, InPAs, InPSb, GaAlNP and a combination thereof, or a quaternary compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and a combination thereof.

For example, the IV-VI group compound may include a binary compound selected from SnS, SnSe, SnTe, PbS, PbSe, PbTe and a combination thereof, a ternary compound selected from SnSeS, SnSeTe, SnSTe, PbSeS, PbSeTe, PbSTe, SnPbS, SnPbSe, SnPbTe and a combination thereof, or a quaternary compound selected from SnPbSSe, SnPbSeTe, SnPbSTe and a combination thereof.

For example, the IV group element may include Si, Ge or a combination thereof. The IV group compound may include a binary compound selected from SiC, SiGe and a combination thereof.

For example, the quantum dot may have a core-shell structure including a core and a shell which surrounds the core. In an embodiment, for example, the core and the shell may include different materials.

For example, the quantum dot may be dispersed in the resin part 232a. For example, the resin part 232a may include an epoxy resin, an acrylic resin, a phenolic resin, a melamine resin, a cardo resin, an imide resin or the like.

The first color-converting part 232 may further include a scattering particle 232c. The scattering particle 232c may scatter an incident light without substantially changing a wavelength of the incident light thereby increasing a path of a light progressing in the color-converting part.

The scattering particle 232c may include a metal oxide or an inorganic material. For example, the metal oxide may include titanium oxide, zirconium oxide, aluminum oxide, indium oxide, zinc oxide, tin oxide or the like. For example, the organic material may include an acrylic resin, an urethane resin or the like.

For example, a light-emitting diode corresponding to the second light-emitting area LA2 may generate a blue light L1 having a peak in a range of about 440 nm to about 480 nm. The first color-converting part 232 changes a wavelength of the blue light L1 incident thereon to emit a red light. A remainder of the blue light L1, which is not color-changed in the first color-converting part 232, is blocked by the second color filter pattern 224. Thus, the second light-emitting area LA2 may selectively emit a red light L2R. For example, the red light L2R may have a peak in a range of about 610 nm to about 650 nm.

The second substrate 200 may further include a second color-converting part 234 overlapping the third light-emitting area LA3. The second color-converting part 234 may include a wavelength-converting particle 234b and a resin part 234a.

For example, a light-emitting diode corresponding to the third light-emitting area LA3 may generate a blue light L1. The second color-converting part 234 changes a wavelength of the blue light L1 incident thereon to emit a green light. A remainder of the blue light L1, which is not color-changed in the second color-converting part 234, is blocked by the third color filter pattern 226. Thus, the third light-emitting area LA3 may selectively emit a green light L2G. For example, the green light L2G may have a peak in a range of about 510 nm to about 550 nm.

The second substrate 200 may further include a compensation part 238 overlapping the first light-emitting area LA1. The compensation part 238 may not include a wavelength-converting material. Thus, the blue light L1 entering the compensation part 238 may pass through the compensation part 238 to enter the first color filter pattern 222 without substantially changing a color thereof. Thus, the first light-emitting area LA1 may emit a blue light L2B.

The compensation part 238 may include a resin part 238a. For example, the resin part 238a may include a same material as the resin parts 232a and 234a of the color-converting parts 232 and 234. The compensation part 238 may further include a scattering particle 238c.

In another embodiment, the compensation part 238 may further include a a wavelength-converting particle such as a quantum dot to increase a color quality, a color-converting efficiency or the like. For example, the wavelength-converting particle may change a wavelength of a UV or a near UV to emit a blue light.

The second substrate 200 includes a partition wall 250 surrounding the color-converting parts 232 and 234 and the compensation part 238. The partition wall 250 may form a space receiving an ink composition configured to form the color-converting parts 232 and 234 and the compensation part 238. Thus, the partition wall 250 may have a grid shape or a matrix shape, in a plan view.

For example, the partition wall 250 may include an organic material such as an epoxy resin, a phenolic resin, an acrylic resin, a silicone resin or the like.

In an embodiment, the partition wall 250 may include a light-blocking material to function as a black matrix. For example, at least a portion of the partition wall 250 may include a light-blocking material such as a pigment, a dye, a carbon black or the like. For example, the partition wall 250 may entirely overlap the light-blocking area BA.

The partition wall 250 may have a single-layered structure or a multi-layered structure. For example, the partition wall 250 may be supposed to have a predetermined thickness to function receiving an ink composition. Thus, the partition wall 250 may have a multi-layered structure.

The second substrate 200 includes a light-reflective layer 260 disposed between the color filter and the color-converting part. The light-reflective layer 260 may selectively reflect an incident light.

In an embodiment, the light-reflective layer 260 may be disposed to overlap the second light-emitting area LA2 and the third light-emitting area LA3, and may not overlap the first light-emitting area LA1. For example, the light-reflective layer 260 may have an opening overlapping the first light-emitting area LA1.

For example, the light-reflective layer 260 may selectively reflect a blue light. Thus, a red light or a green light may pass through the light-reflective layer 260 to outwardly exit through the second light-emitting area LA2 and the third light-emitting area LA3.

In an embodiment, the light-reflective layer 260 may have Distributed Bragg Reflector (DBR) structure. For example, as illustrated in FIG. 3, the light-reflective layer 260 may have a stacked structure including a plurality of layers including different refractive indices. For example, the light-reflective layer 260 may have a structure wherein first refractive layers 261 and 263 having a first refractive index and second refractive layers 262 and 264 having a second refractive index are alternately stacked. For example, the first refractive layers 261 and 263 may include titanium oxide, and the second refractive layers 262 and 264 may include silicon oxide.

However, embodiments are not limited thereto. The light-reflective layer 260 may have various configurations depending on a wavelength of a light to be reflected and conditions for DBR.

In an embodiment, a light-reflective layer may have a nano-pattered shape. For example, as illustrated in FIG. 4, a light-reflective layer 260' may include a wire-grid pattern. The wire-grid pattern may include a metal or an inorganic material such as silicon oxide, silicon nitride or the like. The wire-grid pattern may be disposed on an incident surface on which a light is incident.

For example, as illustrated in FIG. 4, the wire-grid pattern may include a base layer 265a and protruding portions 265b protruding from the base layer 265a. The protruding portions 265b may have a linear shape extending in a direction, and may be arranged in a direction perpendicular to the extending direction.

In an embodiment, the wire-grid pattern may reflect a blue light. For example, a height H1 of the protruding portions 265b may be about 50 nm to about 70 nm. A thickness H2 of the base layer 265a may be about 100 nm to about 120 nm. A pitch P1 of the protruding portions 265b may be about 250 nm to about 300 nm. A width W1 of the protruding portions 265b may have a value obtained by the pitch P1 multiplied by a fill factor. For example, the width W1 of the protruding portions 265b may be about 100 nm to about 150 nm.

However, embodiments are not limited thereto. The wire-grid pattern may have various configurations depending on a material of the pattern and a wavelength of a light to be reflected.

In an embodiment, a light-reflective layer may include a nano-particle. For example, as illustrated in FIG. 5, a light-reflective layer 260" may include a nano-particle 266a. A material and a size of the nano-particle 266a may be varied depending on a wavelength of a light to be reflected.

For example, the nano-particle 266a may include silver to reflect a blue light. The nano-particle 266a including silver scatters a blue light more than other lights. In an embodiment, the nano-particle 266a may have a core-shell structure to adjust a wavelength of a light to be scattered. For example, the nano-particle 266a may include an oxide core including silicon oxide or the like, and a metal shell including silver. In an embodiment, a diameter of the oxide core may be about 1 nm to about 2 nm, and a thickness of the metal shell may be about 20 nm to about 40 nm.

In an embodiment, the light-reflective layer 260" may further include a binder 266b to disperse the nano-particle 266a. The light-reflective layer 260" including the nano-particle 266a and the binder 266b may function as a low-refractive layer to increase a light-extracting efficiency. For example, the binder 266b may include an acrylic resin, a silicon resin or the like.

However, embodiments are not limited thereto. For example, the nano-particle 266a may be provided with a solvent, and then the solvent may be dried. Thus, the nano-particle 266a may be attached to a surface of the partition wall 250 and the first protective layer 240 without a binder.

The second substrate 200 may include a second protective layer 260 covering the color-converting parts 232 and 234 and the compensation part 238. The second protective layer 260 may include an inorganic material such as silicon oxide, silicon nitride or the like.

A filling member 300 may be disposed between the first substrate 100 and the second substrate 200. The filling member 300 may include an organic material such as a silicone resin, an epoxy resin or the like. Furthermore, the filling member 300 may include an appropriate material configured to match a refractive index.

According to embodiments, a blue light passing through the color-converting parts 232 and 234 may be reflected in the color-converting parts 232 and 234 by the light-reflective layer 260. Thus, the blue light may be prevented from being absorbed by the color filter, and may be reused. Thus, a light efficiency of a color-converting substrate and a display device may be improved.

In an embodiment, the color-converting parts 232 and 234 may include the scattering particle. However, embodiments are not limited thereto. For example, when a light efficiency is sufficiently increased, an amount of the scattering particle may be reduced, or the scattering particle may be omitted.

Furthermore, the light-reflective layer 260 may surround a side surface of the color-converting parts 232 and 234 as well as a light-exiting surface of the color-converting parts 232 and 234 to further improve a light efficiency of the color-converting substrate and the display device.

When a light efficiency of the color-converting substrate is improved, a desired thickness of the color-converting parts 232 and 234 may be reduced. Thus, an additional photolithography process of forming the partition wall 250 having a multi-layered structure may be omitted.

Furthermore, when a light efficiency of the color-converting substrate is improved, an amount of a dye or a pigment in the color filter may be reduced.

FIGS. 6, 7, 8 and 9 are cross-sectional views illustrating a method of manufacturing a color-converting substrate according to an embodiment.

Figure 6:
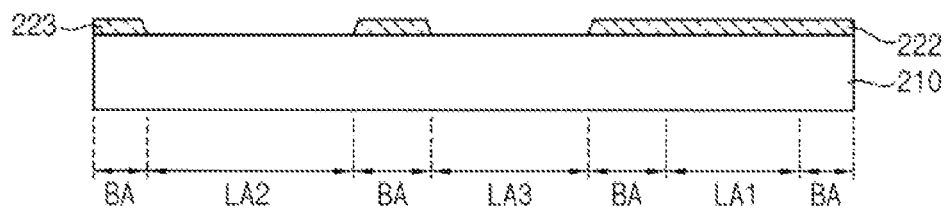
FIGS. 6, 7, 8 and 9 are cross-sectional views illustrating a method of manufacturing a color-converting substrate according to an embodiment.

Referring to FIG. 6, a first color filter pattern 222 and a light-blocking pattern 223 are formed on a base substrate 210. The first color filter pattern 222 may overlap a first light-emitting area LA1. The light-blocking pattern 223 may overlap a light-blocking area BA surrounding a second light-emitting area LA2 and a third light-emitting area LA3.

In an embodiment, the first color filter pattern 222 and the light-blocking pattern 223 may be blue filters selectively transmitting a blue light. For example, the first color filter pattern 222 and the light-blocking pattern 223 may be formed from a color filter composition including a blue pigment and/or a blue dye.

Figure 7:
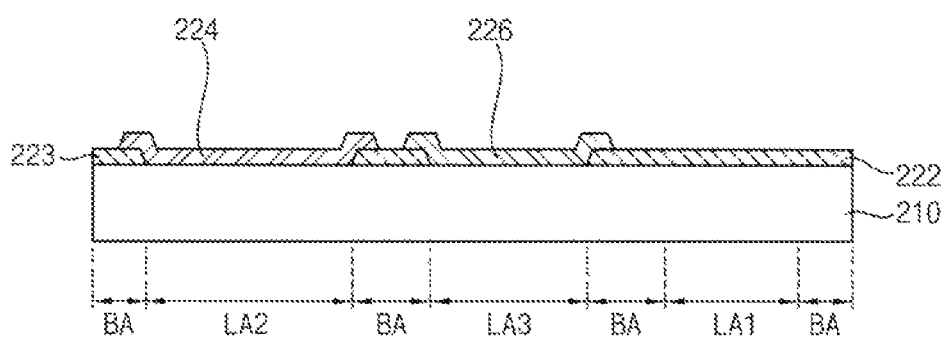

Referring to FIG. 7, a second color filter pattern 224 and a third color filter pattern 226 are formed on the base substrate 210.

The second color filter pattern 224 overlaps the second light-emitting area LA2. The third color filter pattern 226 overlaps the third light-emitting area LA3.

In an embodiment, the second color filter pattern 224 may be a red filter selectively transmitting a red light. For example, the second color filter pattern 224 may be formed from a color filter composition including a red pigment and/or a red dye.

In an embodiment, the third color filter pattern 226 may be a green filter selectively transmitting a green light. For example, the third color filter pattern 226 may be formed from a color filter composition including a green pigment and/or a green dye.

In embodiments, an order of forming the color filters and position thereof are not limited to the illustration. For example, the second color filter pattern 224 or the third color filter pattern 226 may be formed prior to the first color filter pattern 222 so that a portion of the light-blocking pattern 223 may be disposed on the second color filter pattern 224 or the third color filter pattern 226.

Figure 8:
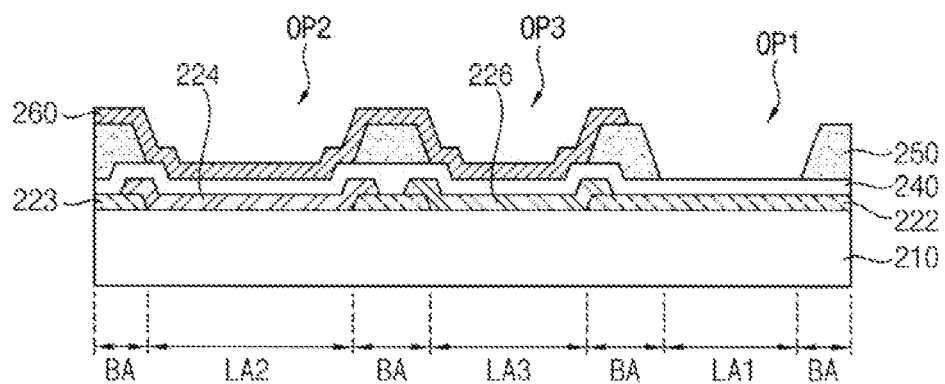

Referring to FIG. 8, a first protective layer 240 is formed to cover the color filter patterns. A partition wall 250 is formed on the first protective layer 240. The first protective layer 240 may be omitted as desired. Thus, the partition wall 250 may be formed on the color filter patterns.

The partition wall 250 may overlap the light-blocking area BA between light-emitting areas LA1, LA2 and LA3.

For example, the partition wall 250 may include an opening overlapping the light-emitting areas LA1, LA2 and LA3.

For example, the partition wall 250 may include a first opening OP1 overlapping the first light-emitting area LA1, a second opening OP2 overlapping the second light-emitting area LA2, and a third opening OP3 overlapping the third light-emitting area LA3.

Thereafter, a light-reflective layer 260 is formed on the second color filter pattern 224, the third color filter pattern 226 and the partition wall 250. In an embodiment, the light-reflective layer 260 may overlap at least the second color filter pattern 224 and the third color filter pattern 226. The light-reflective layer 260 may cover an upper surface and a side surface of the partition wall 250.

The light-reflective layer 260 may be formed by various methods.

In an embodiment, the light-reflective layer 260 having DBR structure, which is illustrated in FIG. 3, may be formed by forming an inorganic layer having a multi-layered structure and then removing a portion of the inorganic layer, which overlaps the first light-emitting area LA1.

In an embodiment, the light-reflective layer 260' including the wire-grid pattern, which is illustrated in FIG. 4 may be formed by forming a preliminary layer including an inorganic material or a metal, and etching the preliminary layer to remove the preliminary layer in the first light-emitting area LA1 and to partially remove the preliminary layer in the second light-emitting area LA2, the third light-emitting area LA3, and the light-blocking area BA.

In an embodiment, the light-reflective layer 260" including the nano-particle, which is illustrated in FIG. 5 may be formed by forming a photoresist layer including the nano-particle and then removing a portion of the photoresist layer, which overlaps the first light-emitting area LA1. In another embodiment, a photoresist composition or an ink, which include the nano-particle, may be selectively provided in the second light-emitting area LA2, the third light-emitting area LA3, and the light-blocking area BA.

Figure 9:
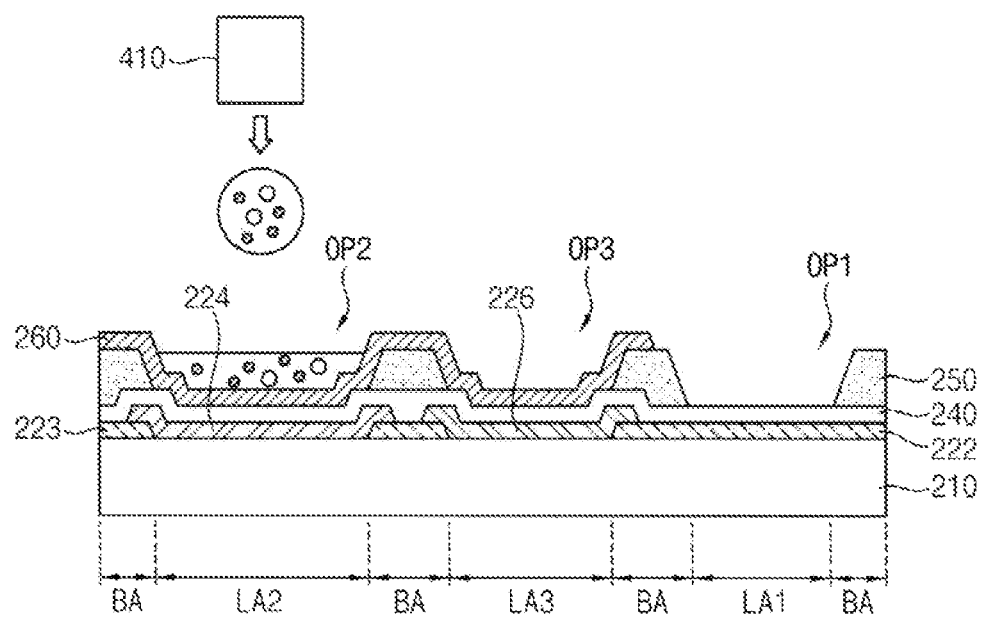

Referring to FIG. 9, an ink including a wavelength-converting particle is provided in the openings OP1, OP2 and OP3 of the partition wall 250.

For example, an inkjet printing apparatus may be used to drop the ink. The inkjet printing apparatus may include a head including a plurality of nozzles 410. The inkjet printing apparatus may provide a first composition, a second composition and a third composition, respectively, in the openings OP1, OP2 and OP3 of the partition wall 250 through the nozzle 410.

In an embodiment, the second and third compositions may include a wavelength-converting particle. For example, the second and third compositions may include a wavelength-converting particle, a binder component and a solvent.

For example, the wavelength-converting particle may include a quantum dot. In an embodiment, the second composition may include a quantum dot capable of emitting a red light, and the third composition may include a quantum dot capable of emitting a green light. The quantum dots may include an organic ligand combined with a surface thereof.

The binder component may include a polymer, a polymerizable monomer or a combination thereof. For example, the polymer may include an aromatic ring structure in a main chain thereof. For example, the aromatic ring structure may include a phenylene group, a biphenylene group, a fluorene or the like. The polymerizable monomer may contain at least one double bond between carbon atoms. For example, the polymerizable monomer may include a (meth)acrylate compound.

The solvent may be properly selected or combined from known materials in view of compatibility with other components, dispersion of a quantum dot, a viscosity, a boiling point or the like.

The second and third compositions may further include a scattering particle, a photo-initiator, a polymer stabilizer, a leveling agent, a coupling agent or a combination thereof, as desired.

The first composition may include a same material as the second and third compositions except for excluding the wavelength-converting particle. For example, the first composition may include a binder component and a solvent, and may further include a scattering particle, a photo-initiator, a polymer stabilizer, a leveling agent, a coupling agent or a combination thereof, as desired.

The inkjet printing apparatus provides ink drops including a corresponding composition in the openings OP1, OP2 and OP3. Thus, the openings OP1, OP2 and OP3 may be filled with the corresponding composition.

The compositions in the openings OP1, OP2 and OP3 may be cured to form a color-converting part and a compensation part. For example, the compositions may be cured by heat and light.

Color-converting substrates and display devices according to embodiments may have various configurations depending on a method thereof or the like.

FIGS. 10, 11, 12, 13 and 14 are cross-sectional views illustrating a display device according to embodiments.

Figure 10:
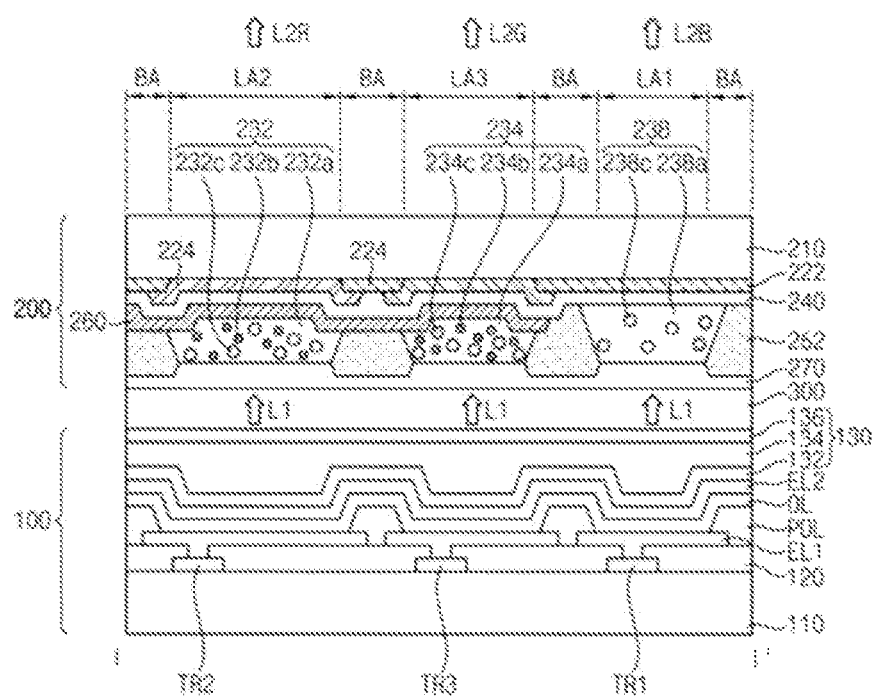
FIGS. 10, 11, 12, 13 and 14 are cross-sectional views illustrating a display device according to embodiments.

Referring to FIG. 10, a light-reflective layer 260 may be disposed between a light-blocking matrix 252 and a base substrate 210.

For example, the light-reflective layer 260 may be formed on a first protective layer 240. A compensation part 238, a first color-concerting part 232 and a second color-concerting part 234 may be formed on the first protective layer 240. The light-blocking matrix 252 may partially cover lower surfaces of the compensation part 238, the first color-concerting part 232 and the second color-concerting part 234. The light-blocking matrix 252 may include a light-blocking material.

Figure 11:
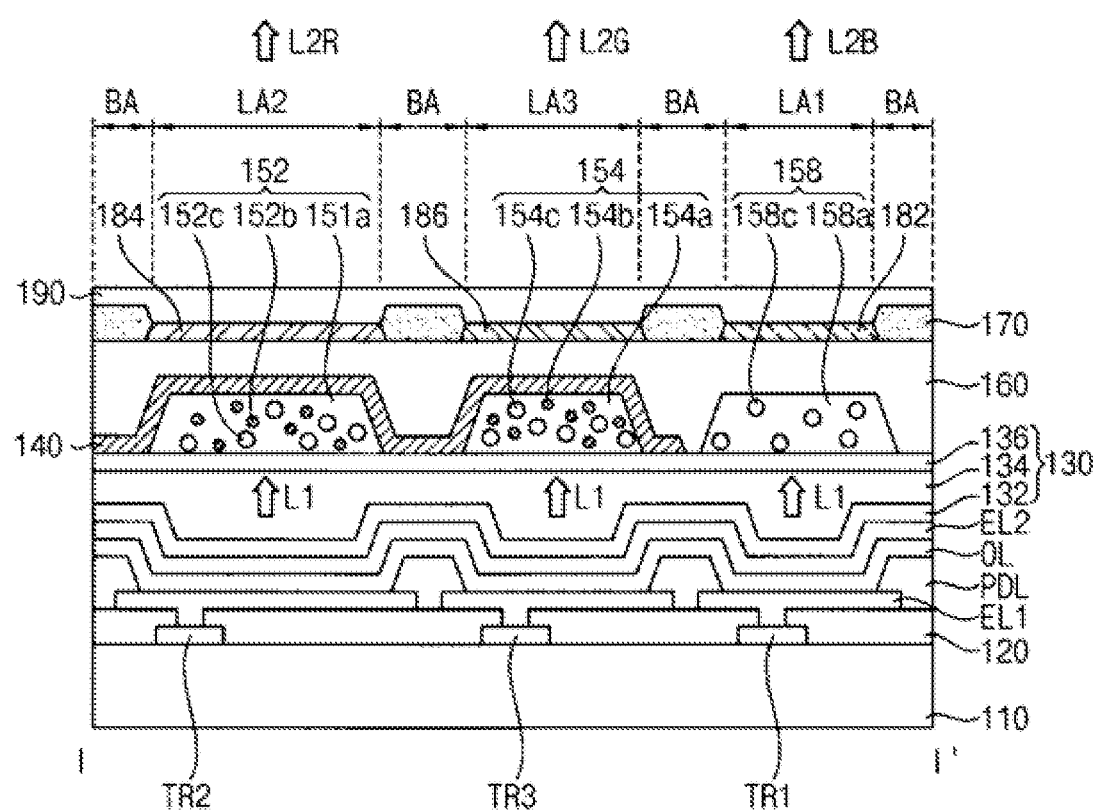

Referring to FIG. 11, a display device according to an embodiment may have a single-substrate structure. For example, a first color-converting part 152, a second color-converting part 154 and a compensation part 158 may be formed on an encapsulation layer 130. The first color-converting part 152, the second color-converting part 154 and the compensation part 158 may be formed from a photoresist composition.

For example, the first color-converting part 152 may include a resin part 152a, a wavelength-converting particle 152b and a scattering particle 152c. The second color-converting part 154 may include a resin part 154a, a wavelength-converting particle 154b and a scattering particle 154c. The compensation part 158 may include a resin part 158a and a scattering particle 158c.

The display device includes a light-reflective layer 140 covering the first color-converting part 152 and the second color-converting part 154. For example, the light-reflective layer 140 may cover an upper surface and a side surface of the first color-converting part 152 and the second color-converting part 154. The light-reflective layer 140 may have a substantially same configuration as the previously explained light-reflective layer 260.

The display device may further include a low refractive layer 160 disposed on the light-reflective layer 140 and the compensation part 158. The low refractive layer 160 may have a refractive index smaller than those of the color-converting parts 152 and 154 and the compensation part 158. The low refractive layer 160 may increase a light-extracting efficiency so that brightness and durability of the display device may be increased. For example, the low refractive layer 160 may have a refractive index equal to or less than 1.3.

The low refractive layer 160 may include a hollow particle to have a suitable refractive index. In an embodiment, the low refractive layer 160 may include a hollow particle dispersed in a resin matrix.

The hollow particle may include an inorganic material. For example, the hollow particle may include silica ($SiO_2$), magnesium fluoride ($MgF_2$), iron oxide ($Fe_3O_4$) or a combination thereof.

For example, the resin matrix of the low refractive layer 160 may include an acrylic resin, a siloxane resin, an urethane resin, an imide resin or a combination thereof, which may be properly selected in view of a refractive index and a processability.

A color filter may be disposed on the low refractive layer 160. In an embodiment, the color filter may include a first color filter pattern 182, a second color filter pattern 184 and a third color filter pattern 186. The color filter patterns may overlap a corresponding one of light-emitting areas LA1, LA2 and LA3. A color filter pattern overlapping the compensation pattern 158 may be omitted as desired.

The display device may further include a light-blocking matrix 170. The light-blocking matrix 170 may have a shape surrounding a first light-emitting area LA1, a second light-emitting area LA2 and a third light-emitting area LA3, in a plan view. A light-blocking area BA may be defined by the light-blocking matrix 170.

The light-blocking matrix 170 may be disposed on the low refractive layer 160. For example, the light-blocking matrix 170 may partially cover the color filter patterns 182, 184 and 186. However, embodiments are not limited thereto. For example, after a light-blocking matrix including opening is formed, color filter pattern may be formed in the openings.

The display device may further include a protective layer 190 covering the light-blocking matrix 170 and the color filter patterns 182, 184 and 186. For example, the protective layer 190 may include an organic material, an inorganic material or a combination thereof. In an embodiment, the protective layer 190 may include an inorganic material such as silicon oxide, silicon nitride or the like.

Figure 12:
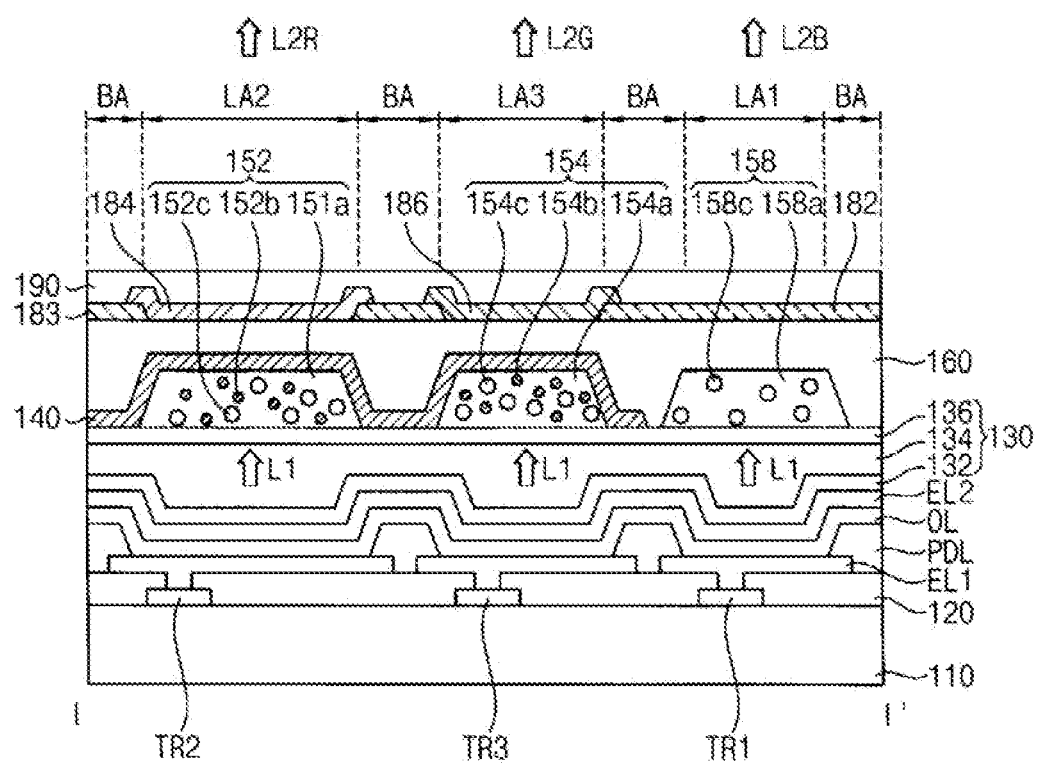

Referring to FIG. 12, a display device may include a light-blocking pattern 183 formed from a same layer as a first color filter pattern 182. The light-blocking pattern 183 may function as a light-blocking matrix.

Figure 13:
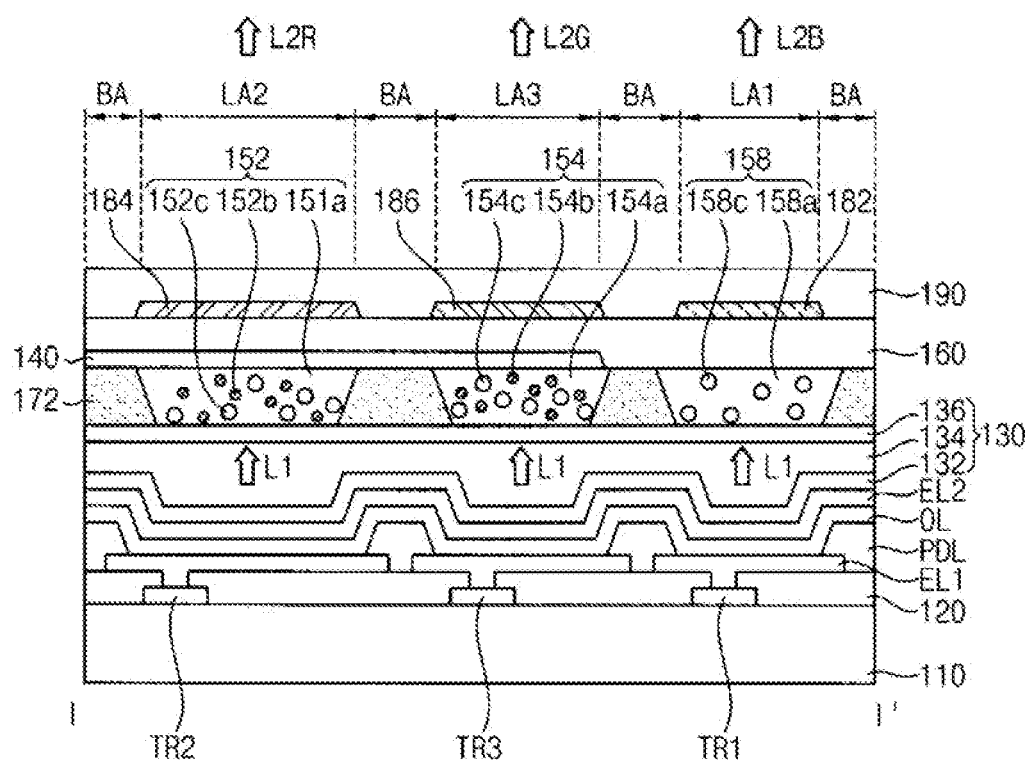

Referring to FIG. 13, a first color-converting part 152, a second color-converting part 154 and a compensation part 158 may be formed by an inkjet printing method.

For example, a partition wall 172 may be formed on an encapsulation layer 130. The partition wall 172 may include openings corresponding to light-emitting areas. Ink compositions may be provided in the openings to form the first color-converting part 152, the second color-converting part 154 and the compensation part 158. The compensation part 158 overlaps a first light-emitting area LA1. The first color-converting part 152 overlaps a second light-emitting area LA2. The second color-converting part 154 overlaps a third light-emitting area LA3.

A light-reflective layer 140 is formed on the partition wall 172, the first color-converting part 152 and the second color-converting part 154.

A low refractive layer 160 is formed on the light-reflective layer 140 and the compensation part 158. Color filter patterns 182, 184 and 186 and a protective layer 190 are formed on the low refractive layer 160.

Figure 14:
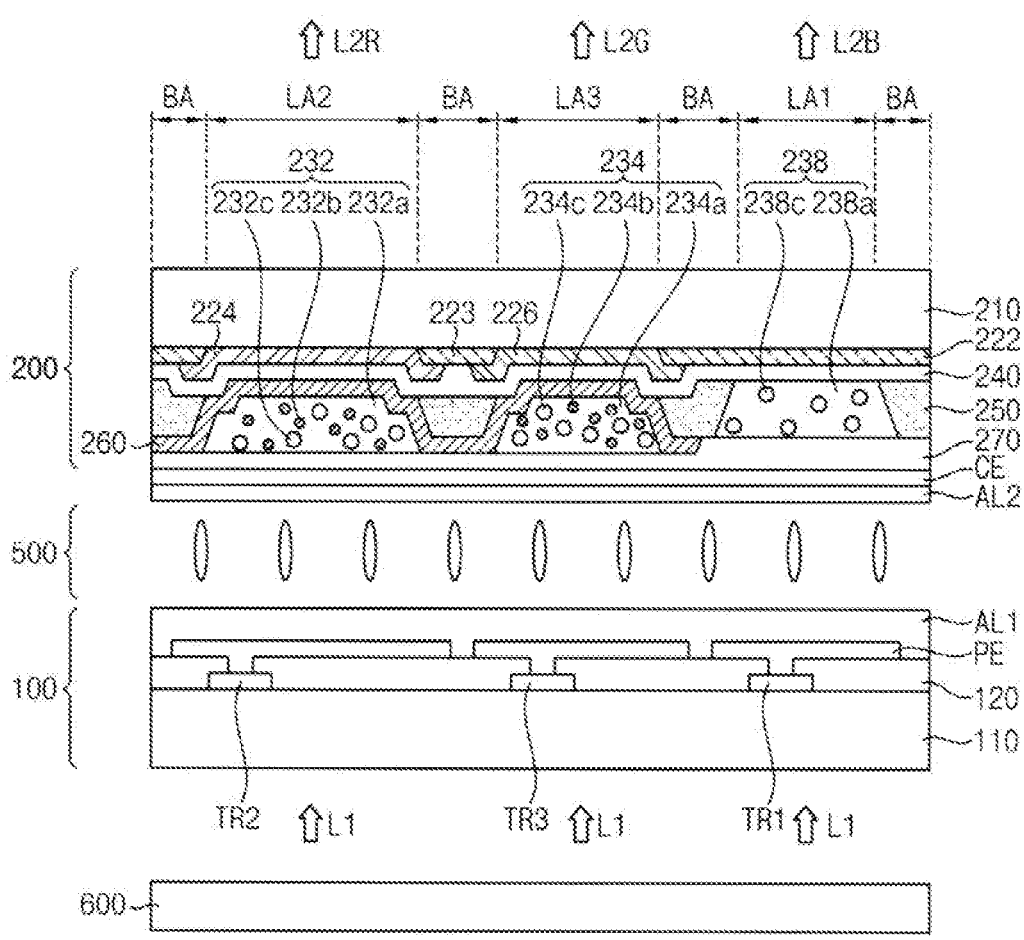

Referring to FIG. 14, a display device includes a display panel and a backlight assembly 600. The display panel includes a first substrate 100 and a second substrate 200. The first substrate 100 includes an array of pixels. A liquid crystal layer 500 is interposed between the first substrate 100 and the second substrate 200.

A pixel includes a driving element TR1, TR2 and TR3 and a pixel electrode PE electrically connected to the driving element TR1, TR2 and TR3. The second substrate 200 includes a common electrode CE. However, embodiments are not limited thereto. For example, the common electrode CE may be included in the first substrate 100.

A first alignment layer AL1 may be disposed on the pixel electrode PE. A second alignment layer AL2 may be disposed on the second substrate 200. The first and second alignment layers AL1 and AL2 may include a polymer such as polyimide, and may be treated by rubbing or photo-orientation to have a predetermined tilt angle or the like.

The second substrate 200 may have a substantially same configuration as the previously explained color-converting substrates except for further including the common electrode CE and the second alignment layer AL2.

A pixel voltage is applied to the pixel electrode PE in response to operation of the driving element TR1, TR2 and TR3. A common voltage is applied to the common electrode CE. Orientation of liquid crystal molecules in the liquid crystal layer 500 is adjusted by an electric field formed by a difference between the pixel voltage and the common voltage. As a result, a transmittance of a light L1 provided by the backlight assembly 600 may be controlled.

The second substrate 200 includes color-converting parts 232 and 234, which changes a wavelength of the light L1 passing through the liquid crystal layer 500 to emit a light having a color different from the incident light L1. The second substrate 200 further includes a compensation part 238 transmits the light L1. The second substrate 200 further includes color filters overlapping the color-converting parts 232 and 234 and the compensation part 238.

For example, the color filters may be disposed on a surface of a base substrate 210. The color filters may filter a light passing therethrough to output a light having a specific color.

In an embodiment, the color filters may include a first color filter pattern 222, a second color filter pattern 224 and a third color filter pattern 226. The color filters may overlap a corresponding one of light-emitting areas LA1, LA2 and LA3. Thus, colors of lights L2R, L2G and L2B exiting from the light-emitting areas LA1, LA2 and LA3 may be determined by the color filters.

In an embodiment, the first color filter pattern 222 overlaps the first light-emitting area LA1. For example, the first color filter pattern 222 may selectively transmit a blue light. The second color filter pattern 224 overlaps the second light-emitting area LA2. For example, the second color filter pattern 224 may selectively transmit a red light. The third color filter pattern 226 overlaps the third light-emitting area LA3. For example, the third color filter pattern 226 may selectively transmit a green light.

In an embodiment, the second substrate 200 includes a light-reflective layer 260 disposed between the color filters and the color-converting parts 232 and 234. Thus, the light L1 entering the color-converting parts 232 and 234 may be more reused to improve a light efficiency of the display device.

In an embodiment, the light L1 entering the color-converting parts 232 and 234 may be a blue light. However, embodiments are not limited thereto. The light L1 may have various wavelengths. For example, the light L1 may include a UV ray. When the light L1 includes a UV ray, a color-converting part including a wavelength-converting particle to emit a blue light may be added instead of the compensation part 238.

As explained in the above, a color-converting substrate may be used for a light crystal display device as well. Furthermore, embodiments may be used for various display devices, which may use a color-converting substrate, such as an electroluminescent display device, a micro LED display device or the like.

Embodiments may be applied to various display devices. For example, embodiment may be applied to vehicle-display device, a ship-display device, an aircraft-display device, portable communication devices, display devices for display or for information transfer, a medical-display device, etc.

The foregoing is illustrative of embodiments and is not to be construed as limiting thereof. Although embodiments have been described, those skilled in the art will readily appreciate that many modifications are possible in the embodiments without materially departing from the novel teachings and features of the invention. Accordingly, all such modifications are intended to be included within the scope of the invention. Therefore, it is to be understood that the foregoing is illustrative of various embodiments and is not to be construed as limited to the specific embodiments disclosed, and that modifications to the disclosed embodiments, as well as other embodiments, are intended to be included within the scope of the invention, as set forth in the following claims and equivalents thereof.

What is claimed is:

1. A color-converting substrate comprising:
    a color-converting part including a wavelength-converting particle configured to change a wavelength of an incident light to emit a light having a color different from the incident light;
    a color filter pattern filtering the light emitted from the color-converting part; and
    a light-reflective layer disposed between the color-converting part and the color filter pattern to selectively reflect a light having a wavelength same as the wavelength of the incident light.

2. The color-converting substrate of claim 1, wherein the light-reflective layer covers a light-exiting surface and a side surface of the color-converting part.

3. The color-converting substrate of claim 1, wherein the light-reflective layer has a stacked structure including a plurality of layers having different refractive indexes.

4. The color-converting substrate of claim 1, wherein the light-reflective layer includes a wire-grid pattern.

5. The color-converting substrate of claim 1, wherein the light-reflective layer includes a nano-particle including silver.

6. The color-converting substrate of claim 5, wherein the nano-particle includes an oxide core and a metal shell including silver.

7. The color-converting substrate of claim 1, further comprising a compensation part configured to transmit an incident light without changing a wavelength of the incident light, wherein the compensation part does not overlap the light-reflective layer.

8. The color-converting substrate of claim 7, wherein the incident light is a blue light.

9. The color-converting substrate of claim 1, wherein the wavelength-converting particle includes a quantum dot.

10. The color-converting substrate of claim 1, wherein the color-converting part further includes a scattering particle.

11. A display device comprising:
    a first substrate including an array of pixels; and
    a second substrate combined with the first substrate,
    wherein the second substrate comprises:
    a color-converting part including a wavelength-converting particle configured to change a wavelength of an incident light to emit a light having a color different from the incident light;
    a color filter pattern configured to filter the light emitted from the color-converting part; and
    a light-reflective layer disposed between the color-converting part and the color filter pattern to selectively reflect a light having a wavelength same as the wavelength of the incident light.

12. The display device of claim 11, wherein the light-reflective layer covers a light-exiting surface and a side surface of the color-converting part.

13. The display device of claim 11, wherein the light-reflective layer has a stacked structure including a plurality of layers having different refractive indexes.

14. The display device of claim 11, wherein the light-reflective layer includes a wire-grid pattern.

15. The display device of claim 11, wherein the light-reflective layer includes a nano-particle including silver.

16. The display device of claim 11, wherein the second substrate further includes a compensation part configured to transmit an incident light without changing a wavelength of the incident light, wherein the compensation part does not overlap the light-reflective layer.

17. A display device comprising:
    an array of pixels;
    an encapsulation layer covering the pixels;
    a color-converting part disposed on the encapsulation layer and including a wavelength-converting particle configured to change a wavelength of an incident light to emit a light having a color different from the incident light;
    a color filter pattern disposed on the color-converting part and configured to filter the light emitted from the color-converting part; and
    a light-reflective layer disposed between the color-converting part and the color filter pattern to selectively reflect a light having a wavelength same as the wavelength of the incident light.

18. The display device of claim 17, wherein the light-reflective layer has a stacked structure including a plurality of layers having different refractive indexes.

19. The display device of claim 17, wherein the light-reflective layer includes a wire-grid pattern.

20. The display device of claim 17, wherein the light-reflective layer includes a nano-particle including silver.

* * * * *

UNITED STATES PATENT AND TRADEMARK OFFICE
CERTIFICATE OF CORRECTION

PATENT NO. : 11,569,308 B2
APPLICATION NO. : 17/157730
DATED : January 31, 2023
INVENTOR(S) : Hyunbae Park et al.

It is certified that error appears in the above-identified patent and that said Letters Patent is hereby corrected as shown below:

On the Title Page

(72) 3rd Inventor's city name should be corrected from "Hwaseonq-si" to "Hwaseong-si".

Signed and Sealed this
Thirtieth Day of July, 2024

Katherine Kelly Vidal
*Director of the United States Patent and Trademark Office*